(12) United States Patent
Ogawa et al.

(10) Patent No.: US 8,460,842 B2
(45) Date of Patent: Jun. 11, 2013

(54) DEFECT REPAIR APPARATUS AND METHOD FOR EUV MASK USING A HYDROGEN ION BEAM

(75) Inventors: Takashi Ogawa, Chiba (JP); Hiroshi Oba, Chiba (JP); Fumio Aramaki, Chiba (JP); Anto Yasaka, Chiba (JP)

(73) Assignee: SII NanoTechnology Inc. (JP)

( * ) Notice: Subject to any disclaimer, the term of this patent is extended or adjusted under 35 U.S.C. 154(b) by 157 days.

(21) Appl. No.: 12/931,412

(22) Filed: Jan. 28, 2011

(65) Prior Publication Data
US 2011/0189593 A1     Aug. 4, 2011

(30) Foreign Application Priority Data

Feb. 2, 2010 (JP) .................. 2010-021540
Dec. 10, 2010 (JP) .................. 2010-269780

(51) Int. Cl.
*G03F 1/74* (2012.01)
*G21G 5/00* (2006.01)

(52) U.S. Cl.
USPC .............................. 430/5; 250/309

(58) Field of Classification Search
USPC .............. 430/5, 30; 118/712; 250/309, 492.1, 250/492.2; 156/345.24
See application file for complete search history.

(56) References Cited

U.S. PATENT DOCUMENTS

| 6,825,468 | B2 * | 11/2004 | Oi et al. ............. 250/311 |
| 8,153,338 | B2 * | 4/2012 | Park et al. ............. 430/5 |
| 2001/0037994 | A1 * | 11/2001 | Ezaki ............. 216/62 |

OTHER PUBLICATIONS

Abstract, publication No. 2009-210805, publication date Mar. 4, 2008.

* cited by examiner

*Primary Examiner* — Stephen Rosasco
(74) *Attorney, Agent, or Firm* — Adams & Wilks

(57) ABSTRACT

A defect repair apparatus for an EUV mask has an ion beam column that scans and irradiates the EUV mask with a focused hydrogen ion beam such that no region of the EUV mask receives an amount of beam irradiation exceeding $4\times10^{16}$ ions/cm$^2$. The ion beam column comprises a gas field ion source having an emitter with a pointed tip end that emits hydrogen ions that form the hydrogen ion beam, and an ion optical system that focuses and scans the hydrogen ion beam onto the EUV mask. A detector detects secondary charged particles generated from the EUV mask when irradiated with the hydrogen ion beam, and an image forming section forms and displays an observation image of the EUV mask on the basis of an output signal from the detector so that a defect in the EUV mask and the progress of the defect repair can be observed.

23 Claims, 5 Drawing Sheets

DEFECT REPAIR APPARATUS AND METHOD FOR EUV MASK USING A HYDROGEN ION BEAM

BACKGROUND OF THE INVENTION

1. Field of the Invention

The present invention relates to a defect repair apparatus for an EUV mask that repairs a defect in an EUV mask using a charged-particle beam.

2. Background Art

In the related art, there is a technique of repairing a defect in a photo-mask employed for a lithographic technique using a focused ion beam. A lithographic technique using EUV (Extreme Ultra Violet) as an exposing source has been developed recently. A mask employed for EUV lithography is formed of a reflection layer made up of ultra-thin films having a multi-layer structure and an absorption layer of a pattern shape. A focused ion beam is irradiated to a defect in the pattern shape of the absorption layer to repair the defect by etching processing or deposition processing. An example is disclosed, for example, in JP-A-2009-210805.

According to the disclosed technique as above, it becomes possible to repair a defect in the EUV mask.

The technique in the related art, however, has a problem that anion beam irradiated to the reflection layer in the EUV mask causes damage to the multi-layer structure, which deteriorates reflectance markedly.

SUMMARY OF THE INVENTION

The invention was devised in view of the foregoing and therefore has an object to provide a defect repair apparatus for an EUV mask that repairs a defect without markedly deteriorating reflectance of the reflection layer in the EUV mask.

In order to provide the defect repair apparatus for an EUV mask as above, it is preferable to use an ion beam that causes less irradiation damage to the EUV mask. In addition, a considerable variance in amount of current of an ion beam during a defect repair causes excessive or insufficient processing. It is therefore necessary to irradiate an ion beam with a stable amount of current to the EUV mask. Further, because the EUV mask has a fine pattern, it is preferable to repair a defect with a high degree of accuracy. In view of the foregoing, the invention provides the following.

A defect repair apparatus for an EUV mask according to one aspect of the invention includes: a gas field ion source that generates a hydrogen ion beam; an ion optical system that focuses the hydrogen ion beam onto the EUV mask; a sample stage on which to place the EUV mask; a detector that detects secondary charged-particles generated from the EUV mask; and an image forming unit that forms an observation image of the EUV mask on the basis of an output signal from the detector. When configured in this manner, an observation image can be obtained by irradiating a hydrogen ion beam to the EUV mask. It thus becomes possible to lessen damage to the multi-layer structure of ultra-thin films forming a reflection layer in the EUV mask.

It is preferable that the defect repair apparatus for an EUV mask further includes a hydrogen gas supply source that supplies a hydrogen gas to the gas field ion source and a purifier that purifies the hydrogen gas. When configured in this manner, a high-purity hydrogen gas can be supplied to the gas field ion source. It thus becomes possible to irradiate a hydrogen ion beam with a stable amount of beam current.

It is preferable that the defect repair apparatus for an EUV mask further includes an ion generation chamber in which to generate ions and an intermediate chamber provided between the ion generation chamber and a vacuum sample chamber. When configured in this manner, it becomes possible to reduce an inflow of an impurity gas from the vacuum sample chamber to the ion generation chamber.

It is preferable that the defect repair apparatus for an EUV mask further includes a current measuring electrode that is provided between the gas field ion source and a focusing lens electrode and measures an amount of current of the hydrogen ion beam. When configured in this manner, it becomes possible to measure an amount of current of the hydrogen ion beam irradiated from the gas field ion source. Accordingly, it becomes possible to control ion beam irradiation conditions on the basis of the measured amount of current for the gas field ion source to irradiate a hydrogen ion beam with a stable amount of current.

It is preferable for the defect repair apparatus for an EUV mask that the gas field ion source and the ion optical system irradiate the hydrogen ion beam having a beam diameter of 5 nm or less onto the EUV mask. Accordingly, it becomes possible to repair a fine pattern of the EUV mask with a high degree of accuracy.

It is preferable for the defect repair apparatus for an EUV mask that an upper limit value of an amount of irradiation of the hydrogen ion beam onto the EUV mask is $4 \times 10^{16}$ ions/$cm^2$. When configured in this manner, it becomes possible to further lessen damage to the multi-layer structure of the ultra-thin films forming the reflection layer in the EUV mask.

It is preferable that the defect repair apparatus for an EUV mask further includes a deposition gas supply system that supplies a deposition gas to the EUV mask. When configured in this manner, by supplying a deposition gas and irradiating a hydrogen ion beam to the EUV mask, a deposition film can be formed locally. It thus becomes possible to repair a defect portion of the absorption layer in the EUV mask with the deposition film.

It is preferable that the defect repair apparatus for an EUV mask further includes an etching gas supply system that supplies an etching gas to the EUV mask. When configured in this manner, by supplying an etching gas and irradiating a hydrogen ion beam to the EUV mask, etching processing can be applied locally at a high speed. It thus becomes possible to repair a defect by effectively applying etching processing to a defect portion of the absorption layer in the EUV mask.

A defect repair method for an EUV mask according to another aspect of the invention includes: obtaining an observation image by scanning and irradiating a hydrogen ion beam onto the EUV mask; setting a defect repair position from the observation image; and repairing a defect by irradiating the hydrogen ion beam to the defect repair position. When configured in this manner, an observation image can be obtained by scanning and irradiating a hydrogen ion beam to the EUV mask. It thus becomes possible to lessen damage to the multi-layer structure of the ultra-thin films forming the reflection layer in the EUV mask.

It is preferable for the defect repair method for an EUV mask that an upper limit value of an amount of irradiation of the hydrogen ion beam is $4 \times 10^{16}$ ions/$cm^2$. When configured in this manner, it becomes possible to further lessen damage to the multi-layer structure of the ultra-thin films forming the reflection layer in the EUV mask.

It is preferable for the defect repair method for an EUV mask that a deposition gas is supplied to the defect when the defect is repaired. When configured in this manner, by supplying a deposition gas and irradiating a hydrogen ion beam to the EUV mask, a deposition film can be formed locally. It thus becomes possible to repair a defect portion of the absorption layer in the EUV mask with the deposition film.

It is preferable for the defect repair method for an EUV mask that an etching gas is supplied to the defect when the defect is repaired. When configured in this manner, by supplying an etching gas and irradiating a hydrogen ion beam to the EUV mask, etching processing can be applied locally at a high speed. It thus becomes possible to repair a defect by effectively applying etching processing to a defect portion of the absorption layer in the EUV mask.

According to the defect repair apparatus for an EUV mask configured as above, it becomes possible to repair a defect in the EUV mask without markedly deteriorating reflectance of the reflection layer in the EUV mask.

DESCRIPTION OF THE PREFERRED EMBODIMENTS

Hereinafter, embodiments of a defect repair apparatus for an EUV mask of the invention is explained.

(1) Defect Repair Apparatus for EUV Mask

Figure 1:
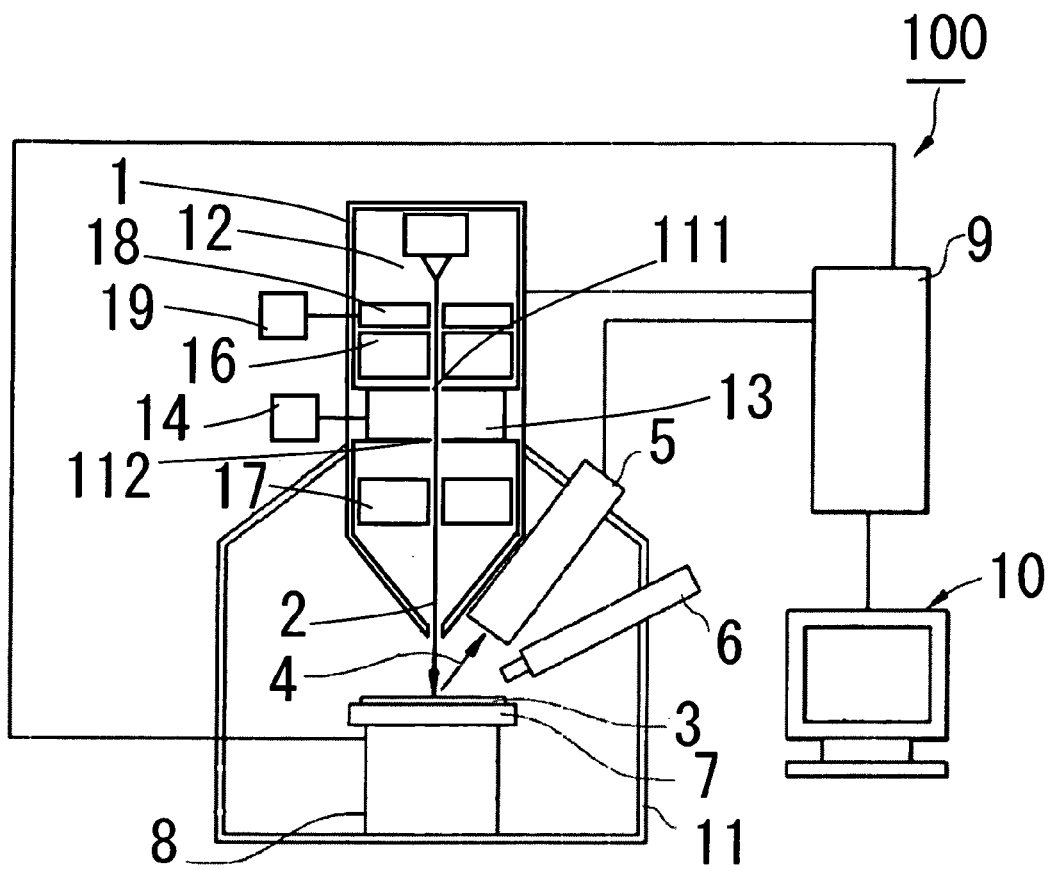
FIG. 1 is a view showing the configuration of a defect repair apparatus for an EUV mask according to one embodiment of the invention.

As is shown in FIG. 1, a defect repair apparatus 100 for an EUV mask according to one embodiment includes an ion beam column 1 provided with an ion optical system having a focusing lens electrode 16 and an objective lens electrode 17 that focus ions generated in an ion source 12 onto a sample 3 placed within a vacuum sample chamber 11.

The defect repair apparatus 100 for an EUV mask also includes a secondary electron detector 5, which is a secondary charged-particle detector that detects secondary electrons 4 generated when an ion beam 2 is irradiated to the sample 3 from the ion beam column 1. Herein, a secondary ion detector is used as the secondary charged-particle detector in a case where secondary ions generated from the sample 3 are detected.

The defect repair apparatus 100 for an EUV mask also includes a gas supply system 6 that supplies a gas to the surface of the sample 3, a sample holder 7 that fixes the sample 3, and a sample stage 8 that moves the sample 3.

The defect repair apparatus 100 for an EUV mask uses a reflected ion detector as the secondary charged-particle detector in a case where reflected ions generated from the sample 3 are detected. The defect repair apparatus 100 for an EUV mask further has an image forming section that includes an image forming unit 9 that forms an observation image from a scan signal of an ion beam 2 and a detection signal from the secondary electron detector 5 and a display unit 10 that displays an observation image thereon.

(2) Ion Source

Figure 2:
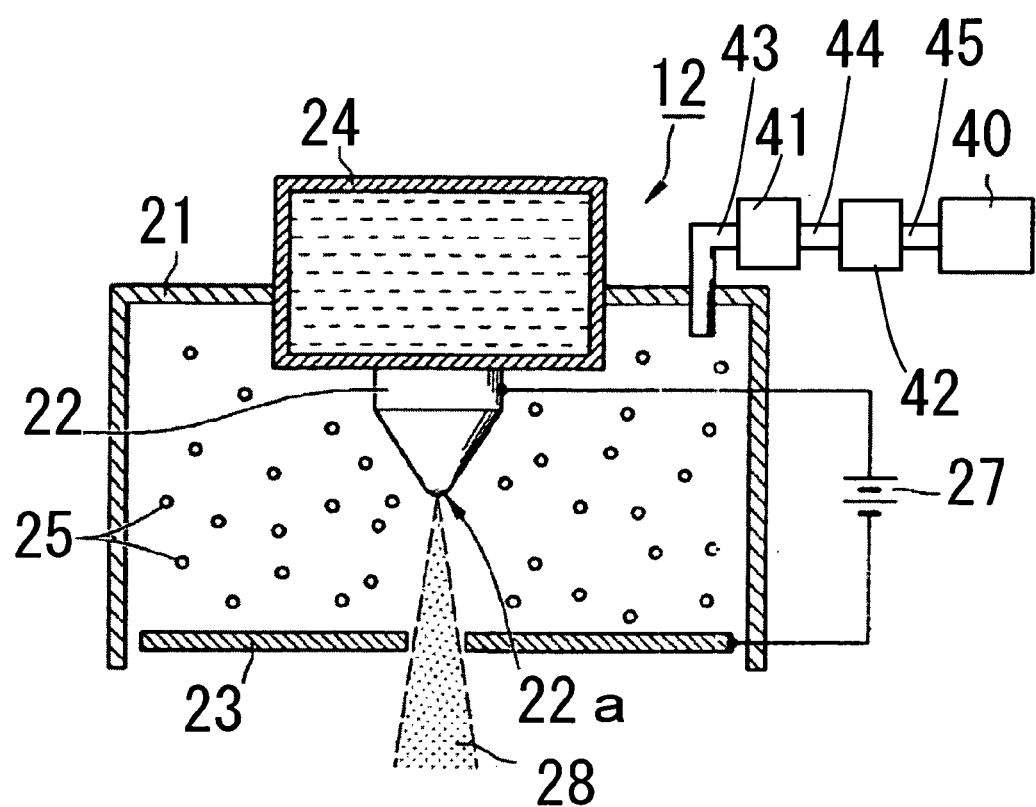
FIG. 2 is a view showing the configuration of an ion source in the defect repair apparatus for an EUV mask according to one embodiment of the invention.

The ion source 12 is a gas field ion source and, as is shown in FIG. 2, includes an ion generation chamber 21, an emitter 22, an extraction electrode 23, and a cooling device 24.

The cooling device 24 is provided to a wall portion of the ion generation chamber 21. The emitter 22 of a needle shape is attached to the cooling device 24 on a surface facing the ion generation chamber 21.

The cooling device 24 cools the emitter 22 with a cooling medium, such as liquid nitrogen and liquid helium, stored inside thereof. As the cooling device 24, a GM or pulse tube closed cycle refrigerator or a gas flow refrigerator is available.

The extraction electrode 23 having an opening at a position opposing a tip end 22a of the emitter 22 is provided in the vicinity of an opening end of the ion generation chamber 21.

The ion generation chamber 21 maintains the interior thereof in a high-vacuum state using an air exhauster. A hydrogen gas supply source 40 is connected to the ion generation chamber 21 via gas introduction tubes 43, 44, and 45, so that a slight amount of a hydrogen gas is supplied into the ion generation chamber 21.

The emitter 22 is a member formed by coating a needle-shaped base material made of tungsten or molybdenum with precious metal, such as platinum, palladium, iridium, rhodium, and gold. The tip end 22a is of a pyramidal shape pointed sharply at the atomic level.

Alternatively, the emitter 22 may be the one formed of a needle-shaped base material made of tungsten or molybdenum with the tip end 22a pointed sharply at the atomic level by introducing a nitrogen gas or an oxygen gas to the base material.

The emitter 22 is maintained at a temperature as low as or lower than about 100 K by the cooling device 24 while the ion source 12 is in operation. A voltage is applied between the emitter 22 and the extraction electrode 23 by a power supply 27.

When a voltage is applied between the emitter 22 and the extraction electrode 23, an extremely large electric field is developed at the sharply pointed tip end 22a while hydrogen molecules 25 are polarized and attracted to the emitter 22 and turn into hydrogen ions as they lose electrons through tunneling at a high field position of the tip end 22a. The hydrogen ions are repelled by the emitter 22 maintained at positive potential and come flying out toward the extraction electrode 23. Hydrogen ions 28 ejected to an ion optical system through the opening in the extraction electrode 23 form an ion beam 2. In the case of a gas field ion source, hydrogen ions include hydrogen molecular ions and hydrogen atomic ions and a ratio thereof varies with a voltage. Under normal use conditions, most of the hydrogen ions are hydrogen molecular ions.

The tip end 22a of the emitter 22 is of an extremely pointed shape. Because hydrogen ions fly out from the tip end 22a, an energy distribution width of an ion beam 2 emitted from the ion source 12 is extremely narrow. For example, in comparison with a plasma gas ion source or a liquid metal ion source, an ion beam with a smaller beam diameter at higher intensity can be obtained.

When an applied voltage to the emitter 22 is too large, constituent elements (tungsten and platinum) of the emitter 22 fly out toward the extraction electrode 23 together with hydrogen ions. Accordingly, a voltage to be applied to the emitter 22 during operation (while an ion beam is being emitted) is maintained to a voltage small enough for constituent elements of the emitter 22 not to fly out from the emitter 22.

Meanwhile, the shape of the tip end 22a can be adjusted by taking advantage of the capability of engineering the constituent elements of the emitter 22 as described above. For example, the ion beam diameter can be increased by broadening a region to ionize a gas by intentionally removing elements positioned at the leading edge of the tip end 22a.

In addition, by heating the emitter 22, precious metal elements on the surface can be repositioned while preventing the precious metal elements from flying out. It thus becomes possible to restore the sharply pointed shape of the tip end 22a that has become dull with use.

Incidentally, when water molecules are contained in a hydrogen gas supplied to the ion generation chamber 21, water adheres to the emitter 22 and forms a protrusion. Hydrogen ions are then released in a direction different from the optical axis of an ion beam 2. Because adhesion of water molecules occurs randomly, an amount of current of an ion beam 2 released in the optical axis direction may possibly vary considerably. In order to avoid such an inconvenience, a hydrogen gas to be supplied to the ion generation chamber 21 is purified.

Metal tubes are used as the gas introduction tubes 43, 44, and 45. It is particularly preferable to use SUS-EP tubes having a surface roughness made finer by electropolishing. By pre-heating the gas introduction tubes 43, 44, and 45 to several hundred degrees centigrade, adhesion of water onto the inner surface of the tubes can be lessened.

Also, purifiers to purify a hydrogen gas supplied from the hydrogen gas supply source 40 are provided. A first purifier 41 purifies a hydrogen gas by allowing an impurity gas to be absorbed into a getter material made of more than one type of activated metal or to pass through a heated palladium thin film. A second purifier 42 eliminates an impurity with a cold trap using liquid nitrogen.

Consequently, a high-purity hydrogen gas at 9N purity (99.9999999%) or above can be supplied. Either the first purifier or the second purifier alone may be used as the purifiers. Also, the purifiers may be incorporated into the hydrogen gas supply source 40.

Further, in order to reduce an inflow of an impurity gas from the vacuum sample chamber 11 to the ion generation chamber 21, an intermediate chamber 13 in a vacuum state is provided inside the ion beam column 1. The interior of the intermediate chamber 13 is evacuated by a vacuum pump 14 different from the air evacuator used to evacuate the ion generation chamber 12.

An ion beam 2 generated in the ion generation chamber 21 passes through a small-diameter hole between the vacuum chambers to be irradiated to the vacuum sample chamber 11. A hole 111 is provided between the ion generation chamber 21 and the intermediate chamber 13 and a hole 112 is provided between the intermediate chamber 13 and the vacuum sample chamber 11. Herein, it may be configured in such a manner that the intermediate chamber 13 accommodates the objective lens electrode 17 and the hole 112 is positioned closer to the vacuum sample chamber 11 than to the objective lens electrode 17. In particular, in a case where a deposition material gas or an etching gas for a deposition film is used for a defect repair in the vacuum sample chamber 11, an inflow of an impurity gas in the deposition material gas or the etching gas into the ion generation chamber 21 can be reduced.

(3) Ion Optical System

The ion optical system includes, sequentially from the ion source 12 to the vacuum sample chamber 11, the focusing lens electrode 16 that converges an ion beam 2 and the objective lens electrode 17 that focuses the ion beam 2 onto the sample 3.

With the ion beam column 1 configured as above, because a source size can be set to 1 nm or smaller and energy dispersion of an ion beam 2 can be set to 1 eV or lower, a beam diameter can be reduced to 5 nm or smaller. Although it is not shown in the drawing, the ion beam column 1 may be provided with a mass filter, such as an E×B mass filter, to discriminate the atomic number of ions.

(4) Current Amount Measurement

The ion beam column 1 includes a current measuring electrode 18 to measure an amount of current of an ion beam 2 between the ion source 12 and the focusing lens electrode 16. An ammeter 19 connected to the current measuring electrode 18 measures an amount of current of an ion beam 2 irradiated to the current measuring electrode 18.

The extraction electrode 23 in the ion source 12 is controlled so that an amount of current measured by the ammeter 19 stays constant. It thus becomes possible to irradiate an ion beam 2 with a stable amount of current to the sample 3.

(5) Gas Supply System

The gas supply system 6 is configured to supply a deposition material gas of a deposition film (for example, a carbon-based gas, such as phenanthrene and naphthalene, a metal compound gas containing metal, such as platinum and tungsten) onto the surface of the sample 3 through a gas nozzle from a deposition material container.

In a case where etching processing is applied, the gas supply system 6 is capable of supplying an etching gas (for example, xenon fluoride, chlorine, iodine, chlorine trifluoride, fluorine monoxide, and water) through the gas nozzle from the deposition material container.

(6) EUV Mask

Figure 3:
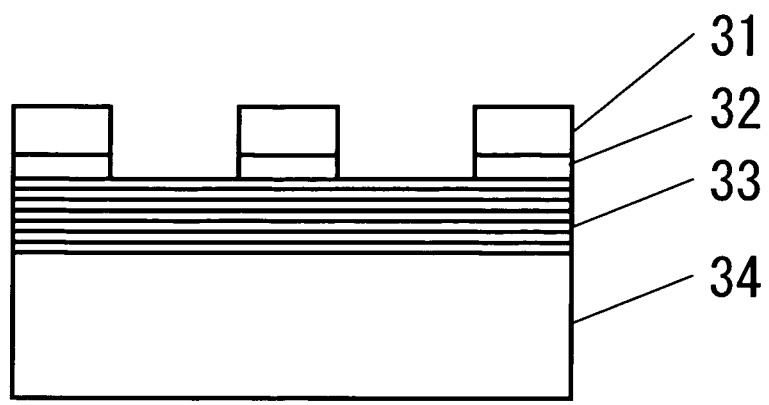
FIG. 3 is a cross section of the configuration of an EUV mask according to one embodiment of the invention.

An EUV mask used as the sample 3 is formed of, as is shown in FIG. 3, a reflection layer 33 of an Mo/Si multi-layer structure, a buffer layer 32, an absorber 31 (pattern shape), which are provided sequentially on a glass substrate 34. According to EUV lithography, EUV light is irradiated on the EUV mask and a mask pattern is transferred using reflected light. When there is a defect in the pattern shape of the absorber 31 of the EUV mask, the pattern shape together with the defect is transferred. In order to avoid such an inconvenience, it is necessary to repair the defect.

Regarding the pattern dimension of the EUV mask, for example, in a case of a process corresponding to a 22-nm node, a half pitch of a line and a space is 88 nm and required defect repair accuracy is about 2 nm or smaller for three sigmas.

(7) Ion Beam Irradiation Damage on EUV Mask

The inventors of the present application conducted a simulation and an experiment for ion beam irradiation damage on an EUV mask. In the experiment, a damaged state of the EUV mask by irradiation of an ion beam to the Mo/Si multi-layer structure, which is the reflection layer, was examined.

Helium ion beams with amounts of beam irradiation of $4 \times 10^{15}$ ions/cm$^2$, $4 \times 10^{16}$ ions/cm$^2$, and $4 \times 10^{17}$ ions/cm$^2$ were irradiated at an acceleration voltage of 30 kV and sectional TEM (Transmission Electron Microscopy) images of the Mo/Si multi-layer structure after irradiation were obtained.

Then, it was found that mixing had occurred in the Mo/Si multi-layer structure to a depth of 280 nm from the sample surface in the EUV masks irradiated by helium ions with amounts of beam irradiation of $4 \times 10^{16}$ ions/cm$^2$ and $4 \times 10^{17}$ ions/cm$^2$. A simulation in the process of ion implantation by the Monte Carlo method was also conducted and the ion implantation depth was in agreement with the experiment result.

Reflectance of EUV masks for EUV light after irradiation of ion beams was measured. Then, it was found that reflectance was deteriorated markedly by irradiation of ion beams with amounts of beam irradiation of $4 \times 10^{16}$ ions/cm$^2$ and $4 \times 10^{17}$ ions/cm$^2$.

In view of the foregoing, it can be said that mixing occurs in the multi-layer structure by irradiating an ion beam onto the reflection layer and reflectance of the EUV mask for EUV light is consequently deteriorated. Also, damage becomes larger as an amount of beam irradiation increases. With a helium ion beam, it was found that deterioration in reflectance is small when an amount of beam irradiation was $4\times10^{15}$ ions/cm$^2$, which is, however, insufficient to repair a defect portion.

Given these circumstances, the inventors of the application paid attention to hydrogen ions having a smaller atomic number than helium ions. A simulation in the process of ion implantation by the Monte Carlo method was conducted and a comparison was made as to the numbers of repelled atoms within the sample when incident ions were implanted. Then, it was found that when incident ions were hydrogen ions, the number of repelled ions was about 1/10 of that when incident ions were helium ions. On the basis of this finding, the inventors achieved an idea that a hydrogen ion beam is effective as a beam used to repair a defect in an EUV mask.

Hence, the inventors of the application conducted an experiment to check a relation between an amount of irradiation of a hydrogen ion beam and a damaged state of the reflection layer in the EUV mask. Hydrogen ion beams with amounts of beam irradiation of $4\times10^{16}$ ions/cm$^2$ and $4\times10^{17}$ ions/cm$^2$ were irradiated at an acceleration voltage of 30 kV and sectional TEM (Transmission Electron Microscopy) images of the Mo/Si multi-layer structure after irradiation were obtained.

Then, it was found that a damaged state in the sectional TEM image in the case of an amount of beam irradiation of $4\times10^{16}$ ions/cm$^2$ was substantially equal to a damaged state in the case of a helium ion beam with an amount of beam irradiation of $4\times10^{15}$ ions/cm$^2$. In other words, a hydrogen ion beam with an amount of beam irradiation of $4\times10^{16}$ ions/cm$^2$ is practical because even when it is irradiated to the reflection layer, deterioration in reflectance of the reflection layer is small and an amount of irradiation is sufficient to repair a defect portion.

Also, it was found that a region where mixing occurred was 140 nm deep from the sample surface. This result is in agreement with the result of the simulation in the process of ion implantation by the Monte Carlo method.

In view of the foregoing, it can be said that it becomes possible to repair a defect in an EUV mask while lessening damage to the EUV mask by using a hydrogen ion beam.

First Embodiment

Figure 4:
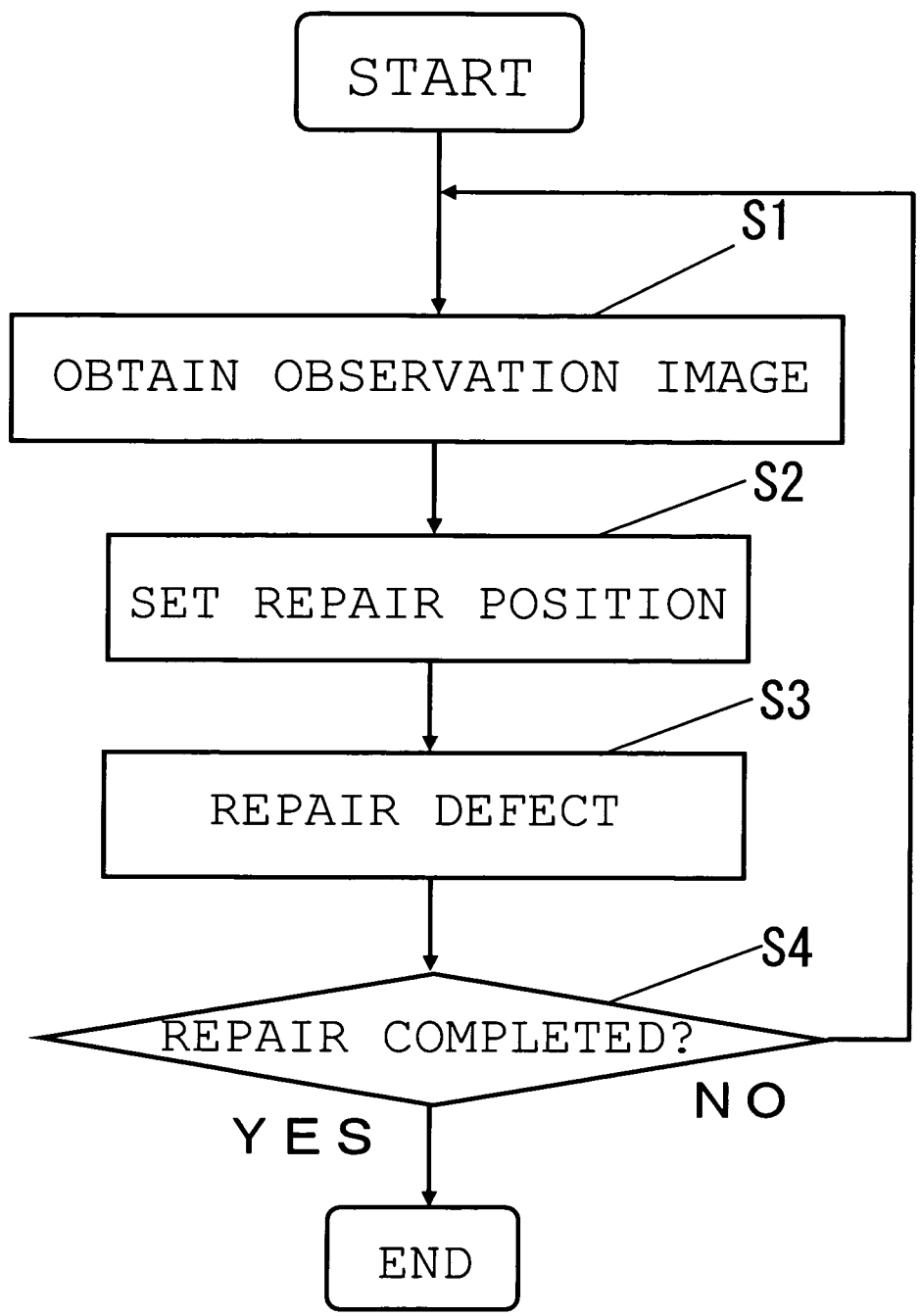
FIG. 4 is a flowchart according to one embodiment of the invention.

One embodiment of the application will now be described along the flowchart of FIG. 4. A defect position in an EUV mask, which is the sample 3 placed on the sample holder 7, is moved onto the sample stage 8 to be in an irradiation region of an ion beam 2.

A hydrogen ion beam is scanned and irradiated to the EUV mask from the ion beam column 1 and secondary electrons 4 generated from the EUV mask are detected by the secondary electron detector 5. An observation image of the EUV mask is obtained in the image forming unit 9 from a scan signal of the hydrogen ion beam and a detection signal from the secondary electron detector 5 (observation image obtaining step S1).

Subsequently, the obtained observation image is displayed on the display unit 10 and a repair position setting to set the ion beam irradiation region on a defect portion is carried out (repair position setting step S2). The ion beam irradiation position is thus determined.

Subsequently, in a case where the defect is a redundant defect of the absorber pattern, xenon fluoride as an etching gas is supplied to the surface of the sample 3 from the gas supply system 6 and defect repair processing is applied by irradiating a hydrogen ion beam to the ion beam irradiation region (defect repair step S3). The processing is ended when the redundant defect portion is etched away.

In a case where the defect is a missing defect of the absorber pattern, a phenanthrene gas as a deposition gas is supplied to the surface of the sample 3 from the gas supply system 6 and the defect repair processing is applied by irradiating a hydrogen ion beam to the ion beam irradiation region. The defect is repaired as a deposition film is deposited on the defect portion.

The repair result is confirmed (S4) and the flow ends when the repair is completed. In a case where the repair is not completed, the flow returns to the observation image obtaining step S1 to repair the defect portion again.

By using hydrogen ions as the ion seed of an ion beam, ion beam irradiation damage on the reflection layer caused by irradiation of an ion beam when repairing a defect portion can be lessened more considerably than in a case where helium ions are used. It thus becomes possible to lessen deterioration in reflectance of the reflection layer for EUV light.

Second Embodiment

Figure 5:
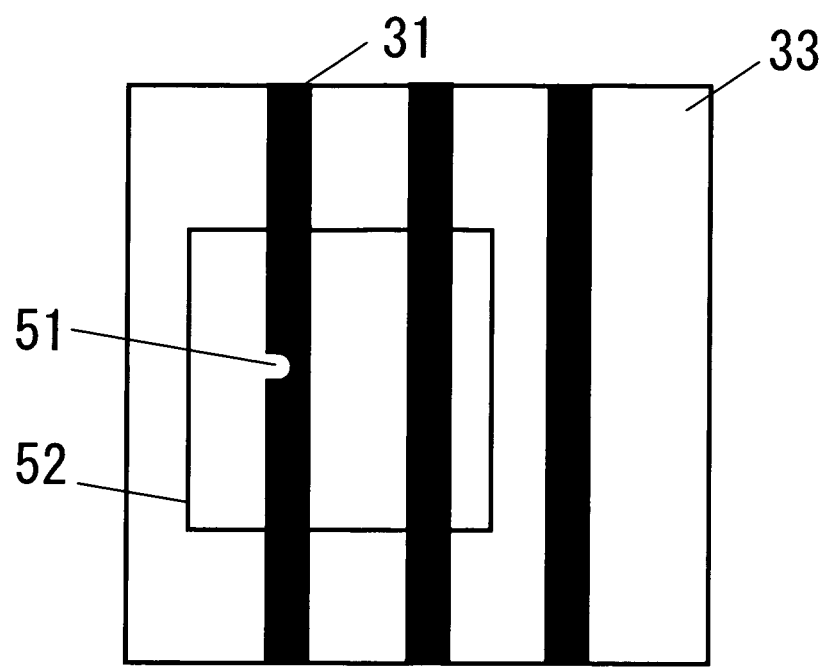
FIG. 5 is a surface view showing the configuration in a part of an EUV mask according to one embodiment of the invention.

An embodiment where the upper limit value of an amount of hydrogen ion beam irradiation to an EUV mask is set to $4\times10^{16}$ ions/cm$^2$ will be described. FIG. 5 is a surface view of a part of an EUV mask and the pattern of the absorber 31 is provided on the reflection layer 33.

An ion beam 2 is scanned and irradiated on an observation region 52 including a defect 51 in the EUV mask. Secondary electrons 4 being generated are detected by the secondary electron detector 5 and an observation image of the observation region 52 is obtained. A repair position is set on the obtained observation image and the defect is repaired.

In a case where the repair is not completed, an ion beam 2 is scanned and irradiated again on the observation region 52 to obtain an observation image. Then, a repair position for additional processing is set on the observation image.

The upper limit value of an amount of hydrogen ion beam irradiation referred to herein means the upper limit value of an amount of ions irradiated onto a given irradiation region. In the repair processing above, it is controlled so that a total amount of ions irradiated onto the defect 51 does not reach the upper limit value.

The defect 51 is of a dimension ranging from several nm to one micron meter and a processing region is set depending on the size of a defect. A current of 5 pA or below is used as an ion beam current and the ion beam current is measured in advance. A dose of irradiation per unit area is calculated on the basis of the processing region and the current to indicate the maximum time over which irradiation is allowed. This enables an operator to perform a repair operation by paying attention to the upper limit value of an amount of irradiation.

In a case where an amount of irradiation has reached the upper limit value, it is possible to perform control to inhibit irradiation of an ion beam 2 onto the same observation region. It thus becomes possible to prevent an ion beam 2 being irradiated onto the EUV mask with an amount of irradiation exceeding the upper limit value.

What is claimed is:

1. A defect repair apparatus for an EUV mask that repairs a defect in the EUV mask using a hydrogen ion beam, comprising:
    a gas field ion source that generates a hydrogen ion beam, the gas field ion source having an emitter with a pointed tip end that emits hydrogen ions that form the hydrogen ion beam;

an ion optical system that focuses the hydrogen ion beam onto the EUV mask;

a sample stage on which to place the EUV mask;

a detector that detects secondary charged-particles generated from the EUV mask; and an image forming unit that forms an observation image of the EUV mask on the basis, of an output signal from the detector.

2. The defect repair apparatus for an EUV mask according to claim 1; further comprising:

a hydrogen gas supply source that supplies hydrogen gas to the gas field ion source; and a purifier that is provided between the gas field ion source and the hydrogen gas supply source and purifies the hydrogen gas.

3. The defect repair apparatus for an EUV mask according to claim 1; further comprising:

an ion generation chamber in which the hydrogen ion beam is generated;

a vacuum sample chamber that accommodates the sample stage; and an intermediate chamber provided between the ion generation chamber and the vacuum sample chamber.

4. The defect repair apparatus for an EUV mask according to claim 1; wherein the gas field ion source and the ion optical system irradiate the hydrogen ion beam having a beam diameter of 5 nm or less onto the EUV mask.

5. The defect repair apparatus for an EUV mask according to claim 1; wherein an upper limit value of an amount of irradiation of the hydrogen ion beam onto the EUV mask is $4 \times 10^{16}$ ions/cm$^2$.

6. The defect repair apparatus for an EUV mask according to claim 1; further comprising a current measuring electrode that is provided between the gas field ion source and a focusing lens electrode of the ion optical system and measures an amount of current of the hydrogen ion beam.

7. The defect repair apparatus for an EUV mask according to claim 1; further comprising a deposition gas supply system that supplies a deposition gas to the EUV mask.

8. The defect repair apparatus for an EUV mask according to claim 1; further comprising an etching gas supply system that supplies an etching gas to the EUV mask.

9. A defect repair method for an EUV mask for repairing a defect in the EUV mask using a hydrogen ion beam, comprising:

generating a hydrogen ion beam using a gas field ion source having an emitter with a pointed tip end that emits hydrogen ions;

obtaining an observation image of a region of the EUV mask by scanning and irradiating the hydrogen ion beam onto the EUV mask;

setting a defect repair position of a defect in the EUV mask from the observation image; and repairing the defect by irradiating the hydrogen ion beam to the defect repair position.

10. The defect repair method for an EUV mask according to claim 9; wherein an upper limit value of an amount of irradiation of the hydrogen ion beam onto the EUV mask is $4 \times 10^{16}$ ions/cm$^2$.

11. The defect repair method for an EUV mask according to claim 9; further comprising supplying a deposition gas to the defect while the defect is being irradiated with the hydrogen ion beam to repair the defect.

12. The defect repair method for an EUV mask according to claim 9; further comprising supplying an etching gas to the defect while the defect is being irradiated with the hydrogen ion beam to repair the defect.

13. The defect repair method for an EUV mask according to claim 9; wherein the EUV mask comprises a reflection layer, and an absorption layer pattern provided on the reflection layer; and wherein the repairing of the defect comprises repairing a defect in the absorption layer pattern while irradiating the defect with the hydrogen ion beam.

14. The defect repair method for an EUV mask according to claim 13; wherein irradiating the defect with the hydrogen ion beam is performed without causing substantial deterioration in reflectance of the reflection layer.

15. The defect repair method for an EUV mask according to claim 13; wherein an upper limit value of an amount of irradiation of the hydrogen ion beam onto the EUV mask is $4 \times 10^{16}$ ions/cm$^2$.

16. A defect repair apparatus for repairing a defect in an EUV (Extreme Ultra Violet) mask, comprising:

an ion beam column that scans and irradiates an EUV mask with a focused hydrogen ion beam such that no region of the EUV mask receives an amount of beam irradiation exceeding $4 \times 10^{16}$ ions/cm$^2$, the ion beam column comprising a gas field ion source having an emitter with a pointed tip end that emits hydrogen ions that form the hydrogen ion beam, and an ion optical system that focuses and scans the hydrogen ion beam onto the EUV mask;

a detector that detects secondary charged particles generated from the EUV mask when irradiated with the hydrogen ion beam; and an image forming section that forms and displays an observation image of the EUV mask on the basis of an output signal from the detector so that a defect in the EUV mask and the progress of the defect repair can be observed.

17. A defect repair apparatus according to claim 16; wherein the ion beam column is configured to generate a focused hydrogen ion beam having a beam diameter of 5 nm or smaller.

18. A defect repair apparatus according to claim 16; further comprising a sample chamber in which is disposed a sample stage for supporting the EUV mask and into which extends the ion beam column; and wherein the ion beam column includes an ion generation chamber containing the gas field ion source, an intermediate chamber disposed between the sample chamber and the ion generation chamber and through which the hydrogen ion beam passes from the ion generation chamber to the sample chamber, and means for evacuating the intermediate chamber separately from the ion generation chamber.

19. A defect repair apparatus according to claim 16; further comprising a hydrogen gas supply source that supplies hydrogen gas to the gas field ion source; and at least one purifier that is provided between the gas field ion source and the hydrogen gas supply source and that purifies the hydrogen gas.

20. A defect repair apparatus according to claim 19; wherein the at least one purifier comprises two purifiers connected in series.

21. A defect repair apparatus according to claim 16; further comprising a deposition gas supply system that supplies a deposition gas to the EUV mask while the EUV mask is being irradiated with the hydrogen ion beam to repair a missing defect in the EUV mask.

22. A defect repair apparatus according to claim 16; further comprising an etching gas supply system that supplies an etching gas to the EUV mask while the EUV mask is being irradiated with the hydrogen ion beam to repair a redundant defect in the EUV mask.

23. A defect repair apparatus, according to claim 16; further comprising a current measuring electrode that is provided between the gas field ion source and a focusing lens electrode of the ion optical system and that measures an amount of current of the hydrogen ion beam.

* * * * *